US008449781B2

(12) United States Patent
Darnon et al.

(10) Patent No.: US 8,449,781 B2
(45) Date of Patent: May 28, 2013

(54) SELECTIVE ETCH BACK PROCESS FOR CARBON NANOTUBES INTERGRATION

(75) Inventors: Maxime Darnon, Yorktown Heights, NY (US); Gerald W. Gibson, Yorktown Heights, NY (US); Pratik P. Joshi, Yorktown Heights, NY (US); Ryan M. Martin, Yorktown Heights, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 232 days.

(21) Appl. No.: 12/820,870

(22) Filed: Jun. 22, 2010

(65) Prior Publication Data
US 2011/0311825 A1    Dec. 22, 2011

(51) Int. Cl.
*B32B 37/00* (2006.01)
*C03C 25/68* (2006.01)

(52) U.S. Cl.
USPC .................................. 216/7; 216/56

(58) Field of Classification Search
USPC ...................................... 216/7, 56
See application file for complete search history.

(56) References Cited

U.S. PATENT DOCUMENTS

| 5,212,043 | A | 5/1993 | Yamamoto et al. |
|---|---|---|---|
| 5,212,046 | A | 5/1993 | Lamola et al. |
| 5,296,332 | A | 3/1994 | Sachdev et al. |
| 6,087,064 | A | 7/2000 | Lin et al. |
| 6,132,926 | A | 10/2000 | Jung et al. |
| 7,041,748 | B2 | 5/2006 | Lin et al. |
| 7,056,840 | B2 | 6/2006 | Miller et al. |
| 7,709,177 | B2 | 5/2010 | Angelopoulos et al. |
| 2008/0286467 | A1 | 11/2008 | Allen et al. |
| 2009/0291389 | A1 | 11/2009 | Allen et al. |
| 2010/0108132 | A1* | 5/2010 | Tsakalakos et al. .......... 136/256 |

FOREIGN PATENT DOCUMENTS

| EP | 0789278 A2 | 8/1997 |
|---|---|---|
| EP | 0794458 A2 | 9/1997 |
| WO | WO-9637526 A1 | 11/1996 |
| WO | WO-9733198 A1 | 9/1997 |

* cited by examiner

*Primary Examiner* — Roberts Culbert
(74) *Attorney, Agent, or Firm* — Novak Druce Connolly Bove + Quigg LLP; Louis J. Percello, Esq.

(57) ABSTRACT

The present disclosure relates to a method for selectively etching-back a polymer matrix to expose tips of carbon nanotubes comprising:
  a. growing carbon nanotubes on a conductive substrate;
  b. filling the gap around the carbon nanotubes with a polymeric fill matrix comprising at least one latent photoacid generator; and
  c. selectively etching-back the polymeric fill matrix to expose tips of the carbon nanotubes.

12 Claims, 2 Drawing Sheets

SELECTIVE ETCH BACK PROCESS FOR CARBON NANOTUBES INTERGRATION

FIELD OF THE DISCLOSURE

The present disclosure relates to a process for selectively etching-back and exposing carbon nanotubes.

BACKGROUND

Carbon nanotubes (CNTs; sometimes referred to as buckytubes) are allotropes of carbon with a cylindrical nanostructure. These cylindrical carbon molecules have novel electrical, mechanical, thermal and chemical properties that make them useful in applications such as nanotechnology, electronics, optics and other fields of materials science. They exhibit extraordinary strength and unique electrical properties, and are efficient thermal conductors.

Nanotubes are members of the fullerene structural family, which also includes the spherical buckyballs. The ends of a nanotube might be capped with a hemisphere of the buckyball structure. Their name is derived from their size, since the diameter of a nanotube is on the order of a few nanometers (approximately 1/50,000th of the width of a human hair), while they can be up to 18 centimeters in length. Iijima, S. Nature 354, 56-58 (1991), Sumio Iijima & Toshinari Ichihashi, Nature 363, 603-605 (17 Jun. 1993), Wang et al., *Nano Letters* 9 (9): 3137-3141 (2009). Nanotubes are often categorized as single-walled nanotubes (SWNTs) and multi-walled nanotubes (MWNTs) depending on the number of layers of the tube.

The nature of the bonding of a nanotube is described by applied quantum chemistry, specifically, orbital hybridization. The chemical bonding of nanotubes is composed entirely of $sp^2$ bonds, similar to those of graphite. This bonding structure, which is stronger than the $sp^3$ bonds found in diamonds, provides the molecules with their unique strength. Nanotubes naturally align themselves into "ropes" held together by Van der Waals forces.

Most single-walled nanotubes (SWNT) have a diameter of close to 1 nanometer, with a tube length that can be many millions of times longer. The structure of a SWNT can be conceptualized by wrapping a one-atom-thick layer of graphite called graphene into a seamless cylinder. Single-walled nanotubes are an important variety of carbon nanotube because they exhibit electric properties that are not shared by the multi-walled carbon nanotube (MWNT) variants. In particular, their band gap can vary from zero to about 2 eV and their electrical conductivity can show metallic or semiconducting behavior, whereas MWNTs are zero-gap metals. Single-walled nanotubes are the most likely candidate for miniaturizing electronics beyond the micro electromechanical scale currently used in electronics. The most basic building block of these systems is the electric wire, and SWNTs can be excellent conductors. One useful application of SWNTs is in the development of the first intramolecular field effect transistors (FET). Production of the first intramolecular logic gate using SWNT FETs has recently become possible as well. To create a logic gate you must have both a p-FET and an n-FET. Because SWNTs are p-FETs when exposed to oxygen and n-FETs otherwise, it is possible to protect half of an SWNT from oxygen exposure, while exposing the other half to oxygen. This results in a single SWNT that acts as a NOT logic gate with both p and n-type FETs within the same molecule.

Multi-walled nanotubes (MWNT) consist of multiple rolled layers (concentric tubes) of graphite. There are two models which can be used to describe the structures of multi-walled nanotubes. In the so called "Russian Doll" model, sheets of graphite are arranged in concentric cylinders, e.g. a (0,8) single-walled nanotube (SWNT) within a larger (0,10) single-walled nanotube. In the so called "Parchment model," a single sheet of graphite is rolled in around itself, resembling a scroll of parchment or a rolled newspaper. The interlayer distance in multi-walled nanotubes is close to the distance between graphene layers in graphite, approximately 3.4 Å.

The properties of double-walled carbon nanotubes (DWNT) are similar to SWNT their resistance to chemicals can be significantly improved. This is especially important when functionalization is required (this means grafting of chemical functions at the surface of the nanotubes) to add new properties to the carbon nanotubes. In the case of SWNT, covalent functionalization will break some $C=C$ double bonds, leaving "holes" in the structure on the nanotube and thus modifying both its mechanical and electrical properties.

Carbon nanotubes can be used in electronics applications, for example in transistors, light emitters for display, and flexible electrodes. Their possible use as electrical conductors has not been as extensively investigated. The instant disclosure demonstrates growth and patterning as well as integration of carbon nanotubes as an electrical conductor in interconnect structures. The advantages of carbon nanotube-based interconnects include high current carrying capability, no electromigration, robust mechanical properties, and high thermal conductivity.

SUMMARY OF THE INVENTION

The present disclosure relates to a method for selectively etching-back a polymer matrix to expose tips of carbon nanotubes and a structure made according to the method. The method comprises:

a. growing carbon nanotubes on a conductive substrate;
b. filling the gap around the carbon nanotubes with a polymeric fill matrix comprising at least one latent photoacid generator; and
c. selectively etching-back the polymeric fill matrix to expose tips of the carbon nanotubes.

The polymeric fill matrix typically comprises polymers or copolymers or blends of polymers and/or copolymers. For example, the polymeric fill matrix can comprise a poly(hydroxystyrene) based polymer or copolymer or blends of poly (hydroxystyrene) based polymers an/or copolymers. In one embodiment, the poly(hydroxystyrene) based polymer or copolymer or blends of poly(hydroxystyrene) based polymers and/or copolymers comprise(s) aromatic rings, wherein some portion of the aromatic rings contain anthracenylmethyl or naphthalene groups. In another embodiment, the polymer fill matrix comprises a blend of poly(4-hydroxystyrene) and 9-anthracenylmethylated poly(hydroxy styrene) or a blend of tetrahydro-1,3,4,6-tetrakis(methoxymethyl)-imidazo[4,5-d] imidazole-2,5-(1H,3H)-dione and p-nitrobenzyltosylate.

The polymeric fill matrix typically comprises at least one latent photoacid generator, for example, a latent photoacid generator selected from the group consisting of triarylsulfonium salts, diaryliodonium salts, pholoroglucinyl, O,O-dinitrobenzyl sulfonates, benzylsulfones, 1,1,1-trihalides, quartary ammino salts, or a combination thereof.

The polymeric fill matrix is typically etched-back using reactive ion etching (RIE), for example, the etching can be carried out by inductively coupled plasma, capacitively coupled plasma, oxidizing plasma, reducing plasma, or a combination thereof. In one embodiment, the reactive ion etching is performed using inductively coupled plasma or capacitively coupled plasma at a cathode temperature of from about 0° C. to about 500° C. In another embodiment, the reactive ion etching is performed using oxidizing plasma comprising $O_2$, CO, $CO_2$, or a combination thereof. The oxidizing plasma can further comprise Ar, $N_2$, or a combination thereof. In another embodiment, the reactive ion etching is performed using a reducing plasma comprising $H_2$, $NH_3$, or a combination thereof. The reducing plasma can further comprise Ar, $N_2$, or a combination thereof. In another embodiment, the reactive ion etching is performed at a pressure of from about 1 mTorr to about 500 mTorr.

DETAILED DESCRIPTION

Figure 1:
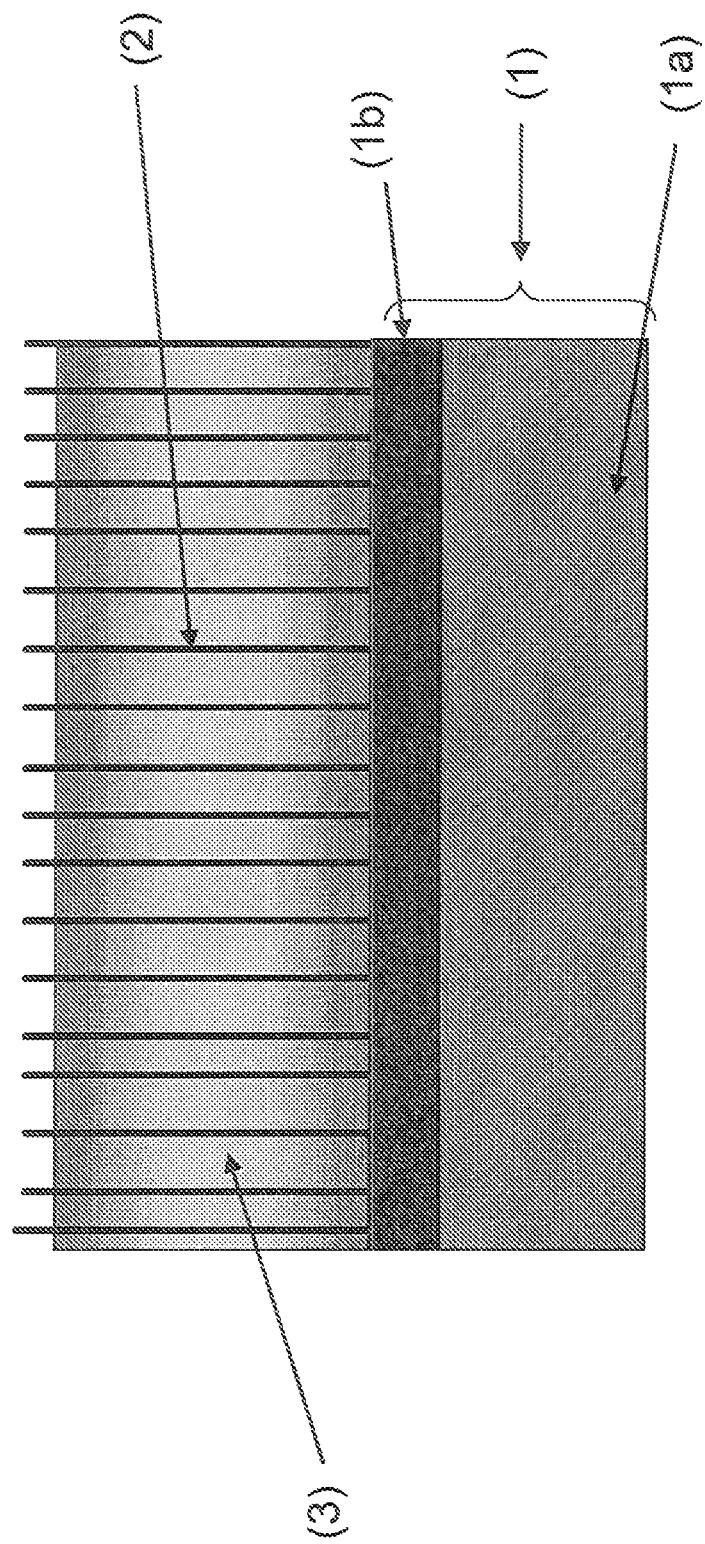
FIG. 1 is a depiction of a carbon nanotube structure according to one embodiment of the instant disclosure.

In the instant disclosure, numerous specific details are set forth, such as particular structures, components, materials, dimensions, processing steps and techniques, in order to provide a thorough understanding. However, it will be appreciated by one of ordinary skill in the art that the disclosure may be practiced without these specific details. In other instances, well-known materials, structures or processing steps have not been described in detail in order to avoid obscuring the disclosure.

It will be understood that when an element as a layer, region or substrate is referred to as being "on," "onto" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terms "comprising," "having," and "including" are used in their open, non-limiting sense.

The terms "a" and "the" are understood to encompass the plural as well as the singular.

By the term "about" when referring to a value, is meant specifically that a measurement can be rounded to the value using a standard convention for rounding numbers. For example, "about 1.5" is 1.45 to 1.54.

The "electrically conductive substrate" can be any substrate capable of conducing electricity and able to support the growth of carbon nanotubes. In one embodiment, the electrically conductive substrate comprises a semiconductive material, an electrically insulative material, an electrically conductive material, devices or structures made of these materials or any combination thereof (e.g., a lower level of an interconnect structure). When the electrically conductive substrate is comprised of a semiconducting material, any semiconductor such as Si, SiGe, SiGeC, SiC, Ge alloys, GaAs, InAs, InP and other III/V or II/VI compound semiconductors, or organic semiconductors may be used. The substrate may also be a flexible substrate containing devices that are suitable for high-speed roll-to-roll processing. In addition to these listed types of semiconducting materials, the electrically conductive substrate may also be a layered semiconductor such as, for example, Si/SiGe, Si/SiC, silicon-on-insulators (SOIs) or silicon germanium-on-insulators (SGOIs). These semiconductor materials may form a device, or devices or structures, which may be disdete or interconnected. These devices and device structures may be for computation, transmission, storage or display of information, such as logic devices, memory devices, switches or display devices. In some embodiments, one or more semiconductor devices such as, for example, complementary metal oxide semiconductor (CMOS) devices, strained silicon devices, carbon-based (e.g., carbon nanotubes and/or graphene) devices, phase-change memory devices, magnetic memory devices, magnetic spin switching devices, single electron transistors, quantum devices, molecule-based switches and other switching or memory devices that can be part of an integrated circuit, can be fabricated on the semiconducting material.

When the electrically conductive substrate is an electrically insulating material, the insulating material can be an organic insulator, an inorganic insulator or a combination thereof including multilayers. The electrically insulating materials may be part of a device, or devices or structures, which may be discrete or interconnected. These devices and structures may be for logic applications or memory applications.

When the electrically conductive substrate is an electrically conducting material, the substrate may include, for example, polySi, an elemental metal, an alloy including at least one elemental metal, a metal silicide, a metal nitride, carbon nanotubes, graphene or combinations thereof including multilayers.

"Carbon nanotubes" are allotropes of carbon with a cylindrical nanostructure. Nanotubes are members of the fullerene structural family. The ends of a nanotube can be capped with a hemisphere of the buckyball structure. Their name is derived from their size, since the diameter of a nanotube is on the order of a few nanometers (approximately $\frac{1}{50,000}$th of the width of a human hair), while they can be up to 18 centimeters in length. Nanotubes are categorized as single-walled nanotubes (SWNTs) and multi-walled nanotubes (MWNTs). Carbon nanotubes can be grown by a variety of techniques well known in the art. For example, carbon nanotubes can be grown by Chemical Vapor Deposition (CVD), which can include High Temperature Chemical Vapor Deposition (HTCVD), Ultra-High Vacuum Chemical Vapor Deposition (UHVCVD), Metal Organic Chemical Vapor Deposition (MOCVD), Hot Wire chemical Vapor Deposition (HTCVD), Water assisted Chemical Vapor Deposition, or combination of any thereof, Arc Discharges, Plasma Assisted Chemical Vapor Deposition (PACVD), Plasma Enhanced Chemical Vapor Deposition (PECVD), Laser Ablation, and a combination thereof.

The "polymeric fill matrix" is deposited onto a conductive substrate having carbon nanotubes grown thereon. It fills the gap around the carbon nanotubes. The polymeric fill matrix is generally a non-conductive substance with insulator properties.

The polymer fill matrix typically comprises a polymer or a copolymer, or a blend of two or more polymers and/or copolymers ("collectively referred to as "polymers"). Examples of these polymers are described in U.S. Pat. No. 7,709,177, which is incorporated herein by reference in its entirety. These polymers are typically phase compatible, soluble in conventional casting solvents, and able to form high integrity, planarizing films. The polymers typically comprise a covalently bonded "chromophore" that can be used as a means of modulating the optical properties of the material and a variety of wavelengths. For example, a poly(hydroxystyrene) (PHS) based polymer that contains some portion of the aromatic rings with a substituent anthracenylmethyl or napthalene group allows for n & k modulation at 248 nm. This functional group can be incorporated into the polymer structure either by direct copolymerization or by starting with a desired polymer platform (i.e. PHS) and attaching the moiety by acid catalyzed electrophilic aromatic substitution/condensation with anthracenemethanol.

In one embodiment, the polymeric fill matrix comprises a polyhydroxystyrene based polymer containing aromatic rings, wherein some portion of the aromatic rings contain anthracenylmethyl or naphthalene groups. In another embodiment, the polymeric fill matrix comprises a blend of poly(4-hydroxystyrene) and 9-anthracenylmethylated poly (hydroxy styrene). In another embodiment, the blend comprises tetrahydro-1,3,4,6-tetrakis(methoxymethyl)-imidazo[4,5-d]imidazole-2,5-(1H,3H)-dione and p-nitrobenzyltosylate.

The optical properties (n and k) at 248 nm can be tuned by controlling the degree of substitution of this functional group. The optical properties can be further modified by the inclusion of other compatible polymer of differing optical properties into the aforementioned blend. For example, unsubstituted PHS can be blended with anthacenemethylated PHS to derive a blend with the desired optical properties. These polymers, being aromatic in nature, have a high carbon to hydrogen ratio and are thus consistent with materials that targeted for use in etch resistance applications. The addition of grafted fused-polycyclic aromatic groups, such as anthracene, add to the etch resistance properties of these copolymers.

These polymers may be rendered insoluble by an acid catalyzed reaction of an added crosslinking molecule with the polymeric matrix. The thermally generated acid is provided by a thermal acid generator (TAG) species. The crosslinking species is one of a number of previously reported (Q. Lin, SPIE Proceedings Vol. 3049 974-987 (1997) polyfunctional species that can react with the phenolic sites of a polymer such as PHS or anthracenemethylated PHS, which is incorporated herein by reference in its entirety. Compounds which are suitable for this application include species based on mono, di, or multi hydroxy substituted methylphenols and derivatives as described in U.S. Pat. No. 5,296,332 and amino plasts as described in U.S. Pat. No. 5,212,046, based on urea or glycoluril resins commercially available from American Cyanamid, melamines, TAGs are chosen from the class of compounds that undergo catastrophic decomposition at a given threshold temperature that results in the formation of one or more molecules of a strong acid.

Other materials that can be used as polymeric fill matrix include polyarylsulfones such as the BARL material, polyhydroxystyrene based derivatives, an example being a copolymer of polyhydroxystyrene and polyhydroxystyrene reacted with anthracenemethanol that contains a cross-linker, and acid catalyst (thermal acid generator), polyimides, polyethers in particular polyarylene ethers, polyarylenesulfides, polycarbonates such as polyarylenecarbonates, epoxies, epoxyacrylates, polyarylenes such as polyphenylenes, polyarylenevinylenes such as polyphenylenevinylenes, polyvinylcarbazole, cyclicolefins, polyesters.

The optical, chemical, and physical properties of the polymeric fill matrix are appropriately tuned. For example, the optical properties such as index of refraction (n) and extinction coefficient (k) are optimized. For example, the index of refraction (n) and extinction coefficient (k) can be from about 1.45 to about 2.1 and about 0.01 to about 0.6, respectively, at 365, 248, 193 and 157 nm.

A "latent photoacid generator" is any photoacid generating compound conventionally used with photoresist compositions that generates a strong acid under heat or irradiation. Conventional photoacid generators are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000), all of which are incorporated herein by reference in their entirety.

The polymeric fill matrix can be selectively etched back to expose tips of the carbon nantobues by methods known in the art. For instance, the polymeric fill matrix can be etched back using reactive ion etching (RIE). The RIE is typically performed using inductively coupled plasma, capacitively coupled plasma, oxidizing plasma, reducing plasma, or a combination thereof. In one embodiment, the RIE is performed at a pressure of from about 1 mTorr to about 500 mTorr. The reactive ion etching is typically carried out at a cathode temperature of from about 0° C. to about 500° C. The reactive ion etching may be performed using oxidizing plasma comprising $O_2$, CO, $CO_2$, or a combination thereof. The oxidizing based plasma can further comprise Ar, $N_2$, or a combination thereof. The reactive ion etching may be performed using a reducing plasma comprising $H_2$, $NH_3$, or a combination thereof. The reducing plasma can further comprise Ar, $N_2$, or a combination thereof.

An exemplary structure prepared as described above is shown in FIG. 1. FIG. 1 depicts a structure comprising an electrically conductive substrate (1) having a silicon wafer (1a) and a coating (1b) such as a dielectric film, NiPtSi, CoSi, TiN, or a combination thereof, wherein carbon nanotubes (2) are grown upon the electrically conductive substrate. A cured polymeric fill matrix comprising at least one latent photoacid generator (3) is embedded around the carbon nanotubes (2) but allows tips of the carbon nantotubes (2) to be exposed.

Figure 2:
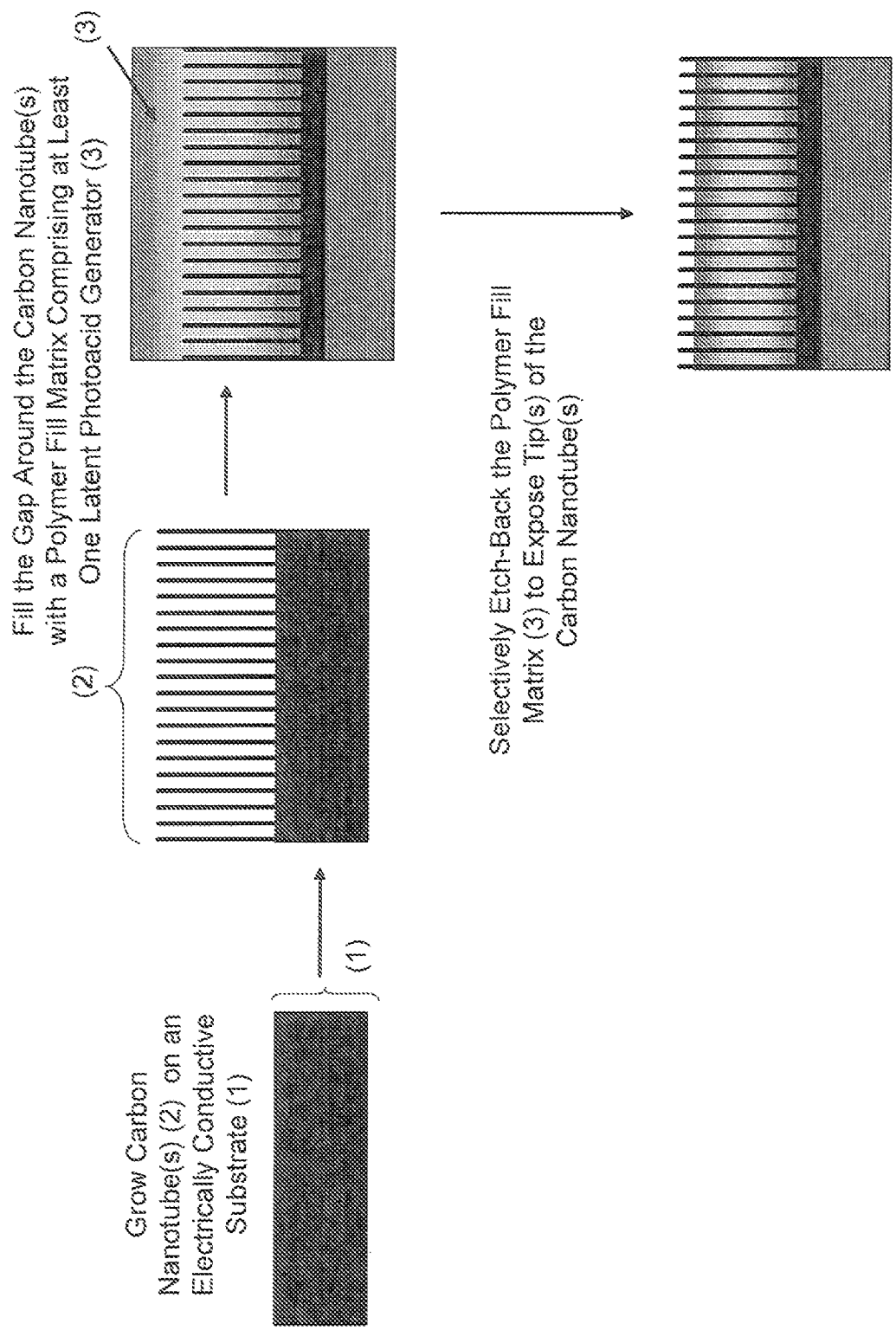
FIG. 2 is a depiction according to one aspect of the disclosure showing a method of filling the gap between carbon nanotubes grown on a conductive substrate with polymeric fill matrix comprising at least one latent photoacid generator and selectively etching back the polymeric fill matrix to expose tips of the carbon nanotubes.

FIG. 2 shows the steps of growing carbon nanotubes (2) on an electrically conductive substrate (1), followed by filling the gap around the carbon nanotubes (2) with a polymeric fill matrix comprising at least one latent photoacid generator (3). After filling the gap, the polymeric fill matrix (3) is selectively etched-back to expose tips of the carbon nanotubes (2).

EXAMPLES

Example 1

Growing Carbon Nanotubes on a Conductive Substrate

Carbon nanotubes were grown on a conductive substrate using high temperature chemical vapor deposition (CVD) process. The conductive substrate is 10-30 A of Cobalt film (as the catalyst) deposited on 250 A of TiN film (as underlayer), which is further deposited on NiPtSi grown silicon wafer. Such substrate was introduced into the deposition chamber, which was kept at 725° C. The chamber pressure was increased to 320 torr. The substrate was then pre-treated with $NH_3$ gas (300 sccm for 30 seconds) before introduction of the carbon containing source ($C_2H_4$). 500 sccm of $C_2H_4$, after which it was flown for 10 minutes to grow the carbon nanotubes.

Example 2

Filling the Gap and Selectively Etching Back the Polymeric Fill Matrix

After growing the carbon nanotubes on the conductive substrate, the polymeric fill matrix NFC-1400 (a hydroxystyrene-based crosslinkable polymer; available from JSR Micro) was used as the polymeric fill matrix. The NFC-1400 was manually applied to the conductive substrate (having carbon nanotubes grown thereon) and the substrate was spun at 1500 rpm for 2 minutes. After which, the NFC-1400 coated substrate was baked at 200° C. for 5 minutes. The thickness of the NFC-1400 film was about 3-5 µm. The NFC-1400 coated carbon nanotubes were then introduced into an inductively coupled plasma source reactive ion etch chamber for selectively etching back the NFC-1400. The etch process was performed for 150 seconds at 150° C. with 30 mT chamber pressure and 2000 W power with 800 W RF bias power using a gas mixture of 100 sccm $NH_3$, 50 sccm Ar and 45 sccm $O_2$.

Having described the subject matter of the present disclosure by way of illustration and example for purposes of clarity of understanding, it will be apparent to one of ordinary skill in the art that the same can be performed by modifying or changing the subject matter within a variety of conditions, formulations and other parameters without affecting its scope or any specific embodiment thereof, and that such modifications or changes are intended to be encompassed within the scope of the appended claims.

All publications, patents, and patent applications mentioned in this specification are indicative of the level of skill of those skilled in the art to which this disclosure pertains, and are herein incorporated by reference in their entirety to the same extent as if each individual publication, patent or patent application was specifically and individually indicated to be incorporated by reference.

It is claimed:

1. A method for selectively etching-back a polymer matrix to expose tips of carbon nanotubes comprising:
    a. growing carbon nanotubes on a conductive substrate;
    b. filling the gap around the carbon nanotubes with a polymeric fill matrix comprising at least one latent photoacid generator,
        wherein the polymeric fill matrix comprises a poly(hydroxystyrene) based polymer or copolymer or blends of poly(hydroxystyrene) based polymers and/or copolymers, and the latent photoacid generator is selected from triarylsulfonium salts, diaryliodonium salts, pholoroglucinyl, O,O-dinitrobenzyl sulfonates, benzylsulfones, 1,1,1-trihalides, quaternary amino salts, or a combination thereof; and
    c. selectively etching-back the polymeric fill matrix to expose tips of the carbon nanotubes.

2. The method of claim 1, wherein the poly(hydroxystyrene) based polymer or copolymer or blends of poly(hydroxystyrene) based polymers and/or copolymers comprise (s) aromatic rings, wherein some portion of the aromatic rings contain anthracenylmethyl or naphthalene groups.

3. The method of claim 2, wherein the polymeric fill matrix comprises a blend of poly(4-hydroxystyrene) and 9-anthracenylmethylated poly(hydroxy styrene) or a blend of tetrahydro-1,3,4,6-tetrakis(methoxymethyl)-imidazo [4,5-d]imidazole-2,5-(1H,3H)-dione and p-nitrobenzyltosylate.

4. The method of claim 1, wherein the polymeric fill matrix is selectively etched-back using reactive ion etching (RIE).

5. The method of claim 4, wherein the reactive ion etching is performed using inductively coupled plasma, capacitively coupled plasma, oxidizing plasma, reducing plasma, or a combination thereof.

6. The method of claim 5, wherein the reactive ion etching is performed using inductively coupled plasma at a cathode temperature of from about 0° C. to about 500° C.

7. The method of claim 5, wherein the reactive ion etching is performed using capacitively coupled plasma at a cathode temperature of from about 0° C. to about 500° C.

8. The method of claim 5, wherein the reactive ion etching is performed using oxidizing plasma comprising $O_2$, CO, $CO_2$, or a combination thereof.

9. The method of claim 8, wherein the oxidizing based plasma further comprises Ar, $N_2$, or a combination thereof.

10. The method of claim 5, wherein the reactive ion etching is performed using a reducing plasma comprising $H_2$, $NH_3$, or a combination thereof.

11. The method of claim 10, wherein the reducing plasma further comprises Ar, $N_2$, or a combination thereof.

12. The method of claim 5, wherein the reactive ion etching is performed at a pressure of from about 1 mTorr to about 500 mTorr.

* * * * *